(12) United States Patent
Dai et al.

(10) Patent No.: US 10,997,109 B2
(45) Date of Patent: May 4, 2021

(54) DEVICE WITH USB PORT

(71) Applicant: HUAWEI TECHNOLOGIES CO., LTD., Guangdong (CN)

(72) Inventors: Yongjun Dai, Wuhan (CN); Xiaosong Liu, Shenzhen (CN); Wenliang Zhang, Wuhan (CN); Cheng He, Wuhan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 26 days.

(21) Appl. No.: 16/467,455

(22) PCT Filed: Dec. 28, 2016

(86) PCT No.: PCT/CN2016/112792
§ 371 (c)(1),
(2) Date: Jun. 6, 2019

(87) PCT Pub. No.: WO2018/103158
PCT Pub. Date: Jun. 14, 2018

(65) Prior Publication Data
US 2020/0065288 A1 Feb. 27, 2020

(30) Foreign Application Priority Data
Dec. 8, 2016 (CN) .......................... 201611123240.6

(51) Int. Cl.
*G06F 13/20* (2006.01)
*G06F 13/40* (2006.01)
(Continued)

(52) U.S. Cl.
CPC ..... *G06F 13/4077* (2013.01); *H01R 13/6594* (2013.01); *H01R 13/6625* (2013.01);
(Continued)

(58) Field of Classification Search
CPC .................................................. G06F 13/4077
(Continued)

(56) References Cited

U.S. PATENT DOCUMENTS

| 8,024,491 B1 | 9/2011 | Wright et al. |
| 2003/0038686 A1 | 2/2003 | Tripathi et al. |

(Continued)

FOREIGN PATENT DOCUMENTS

| CN | 101147330 A | 3/2008 |
| CN | 201440486 U | 4/2010 |

(Continued)

OTHER PUBLICATIONS

Extended European Search Report issued in European Application No. 16923157.8 dated Nov. 5, 2019, 10 pages.
(Continued)

*Primary Examiner* — Henry Tsai
*Assistant Examiner* — Dean Phan
(74) *Attorney, Agent, or Firm* — Fish & Richardson P.C.

(57) ABSTRACT

An electronic device comprising a USB port and a PCB is provided. A first cabling layer of the PCB has a first floating area and a line outside the first floating area, an insulation medium is between the first floating area and the line, a second cabling layer of the PCB is adjacent to the first cabling layer and has a first metal area, an orthographic projection of the first floating area on the second cabling layer and the first metal area have an overlapping area, and the first floating area is not connected to the first metal area; and a metal housing of the USB port has a plurality of fixed contacts fastened to the PCB and not connected to a ground of the PCB, the contacts include a first fixed contact connected to the first floating area and not connected to the first metal area.

12 Claims, 9 Drawing Sheets

(51) Int. Cl.
*H01R 13/6594* (2011.01)
*H01R 13/66* (2006.01)
*H05K 1/02* (2006.01)
*H05K 1/16* (2006.01)
*H05K 1/18* (2006.01)

(52) U.S. Cl.
CPC ............ *H05K 1/0231* (2013.01); *H05K 1/162* (2013.01); *H05K 1/182* (2013.01)

(58) Field of Classification Search
USPC .......................................................... 710/313
See application file for complete search history.

(56) References Cited

U.S. PATENT DOCUMENTS

| | | |
|---|---|---|
| 2005/0186768 A1 | 8/2005 | Sugaya et al. |
| 2005/0221638 A1 | 10/2005 | Berberich |
| 2010/0258333 A1* | 10/2010 | Horan .................... H01B 13/22 174/78 |
| 2012/0305310 A1* | 12/2012 | Takahashi .......... H01R 13/5816 174/74 R |
| 2013/0109233 A1* | 5/2013 | Chung ................ H01R 13/6581 439/607.31 |
| 2013/0132628 A1 | 5/2013 | Li et al. |
| 2013/0203283 A1 | 8/2013 | Tai et al. |
| 2014/0218096 A1* | 8/2014 | Nicollini ............ H03K 17/6871 327/365 |
| 2014/0335728 A1 | 11/2014 | Pocrass |
| 2015/0064958 A1 | 3/2015 | Katayanagi |

FOREIGN PATENT DOCUMENTS

| | | |
|---|---|---|
| CN | 102349201 A | 2/2012 |
| CN | 102436300 A | 5/2012 |
| CN | 103123528 A | 5/2013 |
| CN | 103247908 A | 8/2013 |
| CN | 103268143 A | 8/2013 |
| CN | 103516842 A | 1/2014 |
| CN | 104093284 A | 10/2014 |
| CN | 104111741 A | 10/2014 |
| CN | 104718510 A | 6/2015 |
| CN | 204966916 U | 1/2016 |
| EP | 0875963 A1 | 11/1998 |
| EP | 1419559 B1 | 10/2006 |
| JP | 2004110169 A | 4/2004 |
| JP | 2005534194 A | 11/2005 |
| JP | 2006190873 A | 7/2006 |
| JP | 2014045016 A | 3/2014 |
| JP | 2015023699 A | 2/2015 |
| WO | 2016063520 A1 | 4/2016 |

OTHER PUBLICATIONS

Office Action issued in Japanese Application No. 2019-530684 dated Jun. 8, 2020, 7 pages (with English translation).
PCT International Search Report and Written Opinion issued in International Application No. PCT/CN2016/112792 dated Sep. 12, 2017, 20 pages (with English translation).
Office Action issued in Chinese Application No. 201680091359.1 dated Nov. 6, 2019, 13 pages (with English translation).
Office Action issued in Japanese Application No. 2019-530684 dated Oct. 5, 2020, 5 pages (with English translation).

* cited by examiner

DEVICE WITH USB PORT

CROSS-REFERENCE TO RELATED APPLICATIONS

This application is a National Stage of International Application No. PCT/CN2016/112792, filed on Dec. 28, 2016, which claims priority to Chinese Patent Application No. 201611123240.6, filed on Dec. 8, 2016, both of which are hereby incorporated by reference in their entireties.

TECHNICAL FIELD

The present invention relates to the field of USB connection technologies, and in particular, to a device with a USB port.

BACKGROUND

Currently, an electronic device such as a smartphone or a tablet personal computer performs charging, data transmission, and the like by using a USB port.

Two or four fixed contacts 11 (as shown in FIG. 1a) are usually disposed on a metal housing of the universal serial bus (universal serial bus, USB) port on the electronic device, and the USB port on the electronic device is fastened to a printed circuit board (printed circuit board, PCB) of the electronic device by using the fixed contacts 11. The metal housing of the USB port is usually connected to a ground (as shown in FIG. 1b) on the PCB of the electronic device by using the fixed contacts 11. Because the metal housing of the USB port is relatively close to a USB tongue, non-insulation materials such as perspiration and dust particles accumulate between the tongue and the metal housing of the USB port in daily use, especially between the USB housing and a power pin (VBUS) on the tongue (as shown in FIG. 1b). After a high-voltage and high-current charger is connected, a state of a micro short circuit between a power supply and the ground is formed. The state cannot be detected by using an overcurrent detection mechanism of the electronic device. A current path: VBUS→perspiration→metal housing of the USB port exists, and heat accumulates on the USB port. Consequently, the USB port is burned, endangering user's safety.

The USB port is usually disposed at a lower part of the electronic device such as a mobile phone, and usually an antenna is also disposed at the lower part of the electronic device. When the USB port performs charging or data transmission, the antenna is interfered with. As shown in FIG. 1c, currently the metal housing of the USB port is usually connected to the ground on the PCB of the electronic device by using an additional protection component. The protection component is configured to isolate interference and prevent a micro short circuit. However, the protection component occupies internal space of the electronic device. Consequently, it is not conducive to lightening and thinning of the electronic device.

SUMMARY

Embodiments of the present invention provide an electronic device, a USB cable, and a charger, so that a short circuit of a USB port is prevented, interference of the USB port is shielded, and internal space of the electronic device is not occupied.

A first aspect provides an electronic device, where the electronic device includes a USB port and a PCB; the PCB has at least two cabling layers, a first cabling layer in the at least two cabling layers has a first floating area and a line outside the first floating area, there is an insulation medium between the first floating area and the line outside the first floating area, a second cabling layer in the at least two cabling layers and the first cabling layer are adjacent and isolated by using an insulation material, the second cabling layer has a first metal area, an orthographic projection of the first floating area on the second cabling layer and the first metal area have an overlapping area, and the first floating area is not connected to the first metal area; and a metal housing of the USB port has a plurality of fixed contacts, the plurality of fixed contacts are fastened to the PCB, the plurality of fixed contacts are not connected to a ground of the PCB, the plurality of fixed contacts include a first fixed contact, the first fixed contact is connected to the first floating area, and the first fixed contact is not connected to the first metal area.

The metal housing of the USB port of the electronic device is not connected to the ground of the PCB, so that a short circuit does not occur. In addition, a floating area and a metal area opposite to the floating area are disposed on the PCB, and the metal housing of the USB port of the electronic device is connected to the floating area, so as to form a capacitor, thereby preventing an antenna from being interfered with by the USB port.

With reference to the first aspect, in a first implementation of the first aspect, capacitance formed by the first floating area and the first metal area is $$\frac{\varepsilon * s}{4 * \pi * k * d},$$

where s is an area of overlap of the first floating area and the first metal area, d is a distance between the first floating area and the first metal area, E is a dielectric constant of the insulation medium, and k is an electrostatic constant.

With reference to the first aspect or the first implementation of the first aspect, in a second implementation of the first aspect, the PCB includes a second floating area, the second floating area is located at the first cabling layer, the second cabling layer has a second metal area, an orthographic projection of the second floating area on the second cabling layer and the second metal area have an overlapping area, and the second floating area is not connected to the second metal area; and the plurality of fixed contacts of the USB port include a second fixed contact, the second fixed contact is connected to the second floating area, and the second fixed contact is not connected to the second metal area.

With reference to the first aspect or the first implementation of the first aspect, in a third implementation of the first aspect, a third cabling layer in the at least two cabling layers include a third floating area, a fourth cabling layer in the at least two cabling layers and the third cabling layer are adjacent and isolated by using the insulation medium, the fourth cabling layer is disposed with a third metal area, an orthographic projection of the third floating area on the fourth cabling layer and the third metal area have an overlapping area, and the third floating area is not connected to the third metal area; and the first fixed contact is connected to the first floating area and the third floating area, and the first fixed contact is not connected to the first metal area and the third metal area.

With reference to the third implementation of the first aspect, in a fourth implementation of the first aspect, the first cabling layer is not adjacent to the third cabling layer. Optionally, a distance between the first cabling layer and the third cabling layer is greater than a distance between the first cabling layer and the second cabling layer, and is greater than a distance between the third cabling layer and the fourth cabling layer.

With reference to any one of the first aspect or the first to the fourth implementations of the first aspect, the first metal area is the ground of the PCB. Therefore, noise backflow can be better implemented.

A second aspect provides a charger, where the charger includes a USB port and a PCB; the USB port has a plurality of fixed contacts, the fixed contacts are fastened to the PCB, and the fixed contacts are not connected to a ground of the PCB.

With reference to the second aspect, in a first implementation of the second aspect, the PCB has at least two cabling layers, the at least two cabling layers are isolated from each other by using an insulation material, a first cabling layer in the at least two cabling layers has a first floating area and a line outside the first floating area, there is an insulation medium between the first floating area and the line outside the first floating area, a second cabling layer in the at least two cabling layers and the first cabling layer are adjacent and isolated by using an insulation medium, the second cabling layer has a first metal area, an orthographic projection of the first floating area on the second cabling layer and the first metal area have an overlapping area, and the first floating area is not connected to the first metal area; and the plurality of fixed contacts include a first fixed contact, the first fixed contact is connected to the first floating area, and the first fixed contact is not connected to the first metal area.

With reference to the second aspect, in a second implementation of the second aspect, a soldering pad is disposed on the PCB, and the soldering pad is isolated from a line on the PCB by using an insulation material; and that the fixed contact is not connected to a ground of the printed circuit board is specifically: the fixed contact is connected to the soldering pad.

A third aspect provides a USB cable, where the USB cable includes a first USB port, a second USB port, a shielding cable, and a ground cable; the shielding cable includes a first end and a second end, the first end is close to the first USB port, and the second end is close to the second USB port; the first end is not connected to a metal housing of the first USB port; and the shielding cable is not connected to the ground cable.

With reference to the third aspect, in a first implementation of the third aspect, the second end is not connected to a metal housing of the second USB port.

With reference to the third aspect, in a second implementation of the third aspect, the second end is connected to a metal housing of the second USB port, and an end that is of the shielding cable and that is close to the first USB port is connected to the metal housing of the first USB port.

A fourth aspect provides a charging system, including the electronic device according to any one of the first aspect or the first to the fifth implementations of the first aspect, the charger according to any one of the second aspect or the first to the second implementations of the second aspect, and a USB cable, where the USB cable is configured to connect the electronic device and the charger.

A fifth aspect provides a charging system, including the electronic device according to any one of the first aspect or the first to the fifth implementations of the first aspect, the USB cable according to any one of the third aspect or the first to the second implementations of the third aspect, and a charger, where the first USB port of the USB cable is configured to connect to the charger, and the second USB port of the USB cable is configured to connect to the electronic device.

A sixth aspect provides a data transmission system, including a first electronic device according to any one of the first aspect or the first to the fifth implementations of the first aspect, a second electronic device according to any one of the first aspect or the first to the fifth implementations of the first aspect, and a USB cable, where the USB cable is configured to connect the first electronic device and the second electronic device.

A seventh aspect provides a data transmission system, including a first electronic device according to any one of the first aspect or the first to the fifth implementations of the first aspect, the USB cable according to any one of the third aspect or the first to the second implementations of the third aspect, and a second electronic device, where the first USB port of the USB cable is configured to connect to the second electronic device, and the second USB port of the USB cable is configured to connect to the first electronic device.

The metal housing of the USB port of the electronic device is not connected to the ground of the PCB, so that a short circuit does not occur. In addition, the floating area and the metal area opposite to the floating area are disposed on the PCB, and the metal housing of the USB port of the electronic device is connected to the floating area, so as to form the capacitor, thereby preventing the antenna from being interfered with by the USB port.

BRIEF DESCRIPTION OF DRAWINGS

FIG. 6b is a front view of an implementation corresponding to FIG. 6a;

FIG. 6c is a front view of another implementation corresponding to FIG. 6a;

FIG. 6d is an equivalent schematic diagram of a circuit in FIG. 6a;

DESCRIPTION OF EMBODIMENTS

To make the purpose, technical solutions, and advantages of the embodiments of the present invention clearer, the following describes the technical solutions of the embodiments of the present invention with reference to the accompanying drawings in the embodiments of the present invention.

An electronic device may be a mobile phone (also referred to as a smartphone), a tablet personal computer (Tablet Personal Computer), a personal digital assistant (personal digital assistant, PDA for short), an e-book reader (English: e-book reader) or a wearable device (Wearable Device), a virtual reality interactive device (Virtual Reality Interactive Device), or the like. The electronic device may establish communication with a network by using a 2G (second generation mobile phone communications technical specification), a 3G (third generation mobile phone communications technical specification), a 4G (fourth generation mobile phone communications technical specification), a 5G (fifth generation mobile phone communications technical specification), a W-LAN (wireless local area network), or a possible communication mode in the future.

For ease of description, a structure of the electronic device is described by using a mobile phone as an example.

Figure 1A:
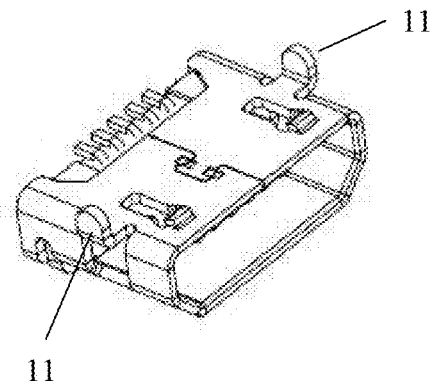
FIG. 1a is a schematic diagram of a USB port in the prior art.
Figure 1B:
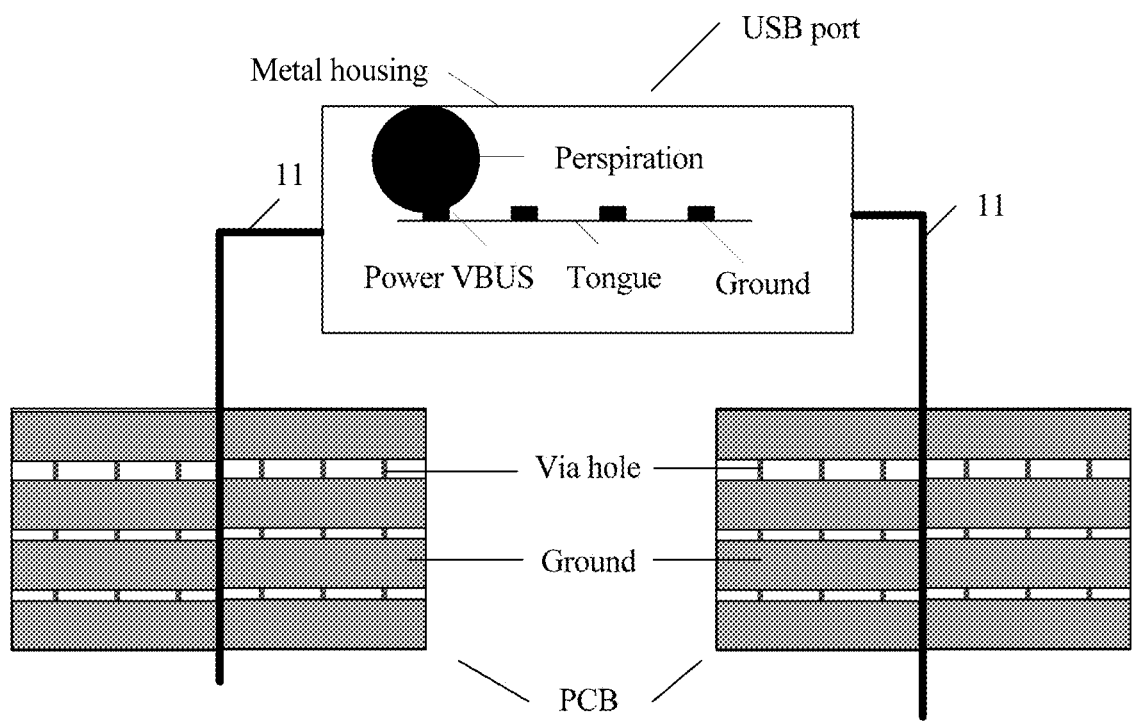
FIG. 1b is a schematic diagram of a micro short circuit in a USB port in the prior art.
Figure 1C:
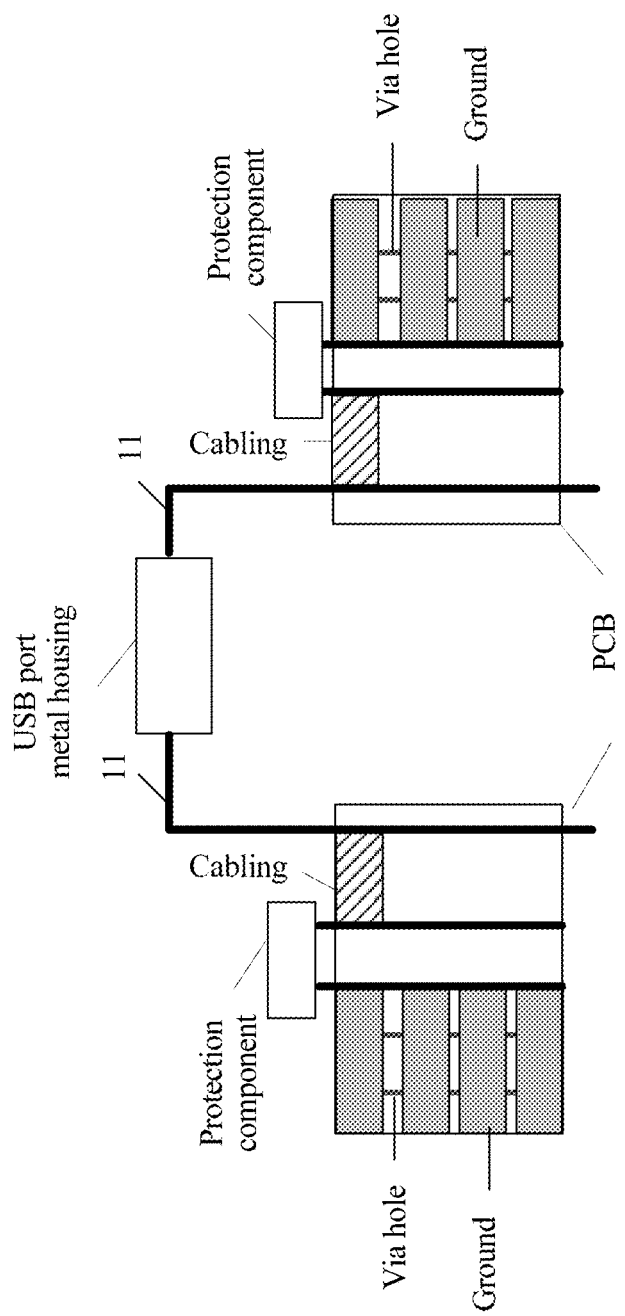
FIG. 1c is a schematic diagram in which a USB port is connected to a PCB by using a protection component in the prior art.
Figure 2:
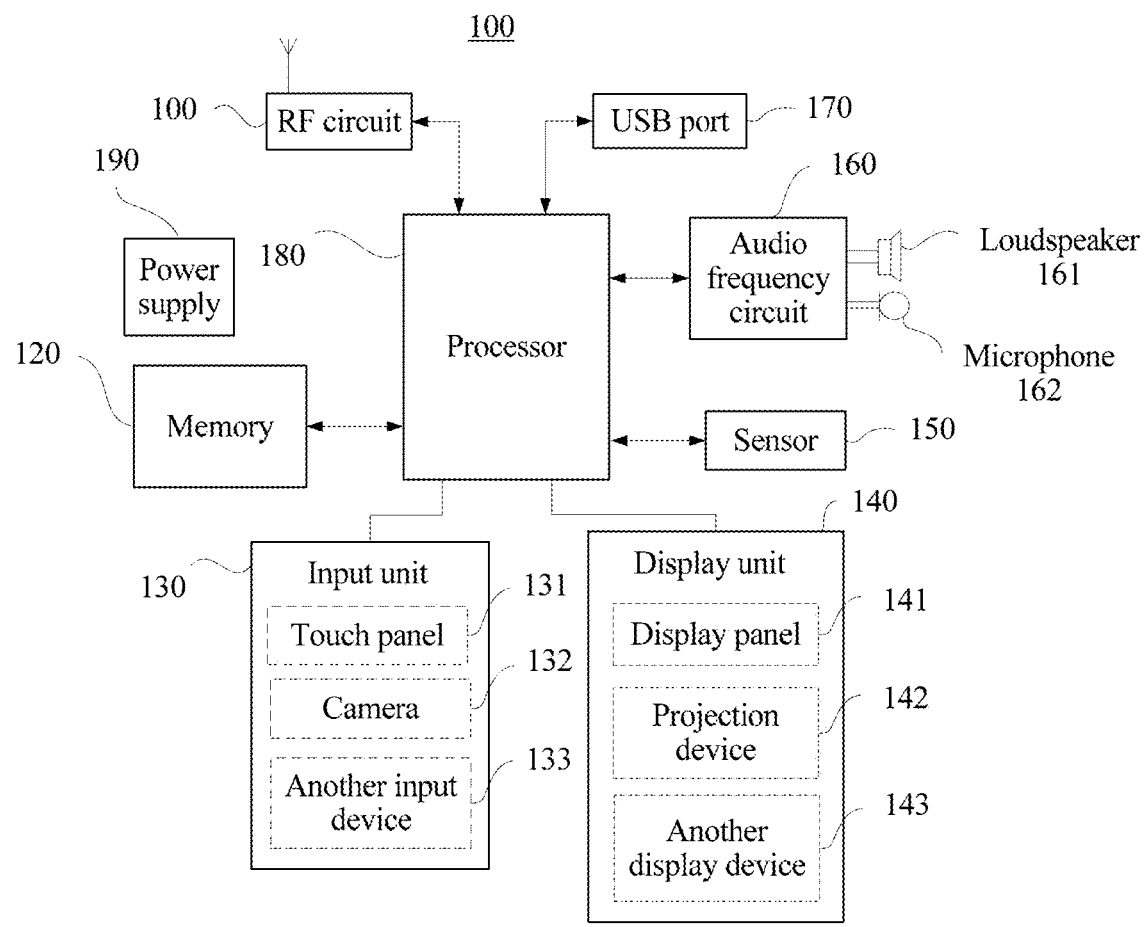
FIG. 2 is a schematic diagram of an architecture of a mobile phone according to an embodiment of the present invention.

FIG. 2 is a schematic structural diagram of a mobile phone 100 according to some embodiments. The mobile phone can support various applications such as a telephone application, an instant message transceiving application, a digital photographing and/or an image shooting application, a web browsing application, a music and/or video playing application, a video communication application, a social networking application, a financial application, a weather application, a shopping application, and an office application.

FIG. 2 is a block diagram of a partial structure of a mobile phone 100 according to some embodiments. Referring to FIG. 2, the mobile phone 100 includes parts such as an RF (Radio Frequency, radio frequency) circuit 110, a memory 120, an input unit 130, a display unit 140, a sensor 150, an audio frequency circuit 160, a USB port 170, a processor 180, and a power supply 190.

A person skilled in the art may understand that the structure of the mobile phone shown in FIG. 2 is merely an example of an implementation, constitutes no limitation on the mobile phone, and may include more or fewer parts than those shown in the figure, or combine some parts, or have different part arrangements.

The following specifically describes each component of the mobile phone 100 with reference to FIG. 2.

The RF circuit 110 may be configured to: receive and send information, or receive and send a signal in a call process; in particular, after receiving downlink information from a base station, send the downlink information to the processor 180 for processing; and send related uplink data to the base station. The RF circuit usually includes but is not limited to an antenna, at least one amplifier, a transceiver, a coupler, an LNA (Low Noise Amplifier, low noise amplifier), and a duplexer. In addition, the RF circuit 110 may communicate with a network and another device through wireless communication. Any communications standard or protocol may be used for the wireless communication, including but not limited to GSM (Global System of Mobile communication, Global System for Mobile Communications), GPRS (General Packet Radio Service, general packet radio service), CDMA (Code Division Multiple Access, Code Division Multiple Access), WCDMA (Wideband Code Division Multiple Access, Wideband Code Division Multiple Access), LTE (Long Term Evolution, Long Term Evolution), an e-mail, and an SMS (Short Messaging Service, short message service).

The memory 120 may be configured to store a software program and a module, and the processor 180 performs various function applications of the mobile phone 100 and data processing by running the software program and the module stored in the memory 120. The memory 120 may mainly include a program storage area and a data storage area. The program storage area may store an operating system, an application program required by at least one function (such as a sound playing function or an image playing function), and the like. The data storage area may store data (such as audio data or a phone book) created based on use of the mobile phone 100, and the like. In addition, the memory 120 may include a high-speed random access memory, or may include a nonvolatile memory such as at least one magnetic disk storage device, a flash memory device, or another volatile solid-state storage device.

The input unit 130 may be configured to receive entered digital or character information, and generate key signal or action signal input related to user setting and function control of the mobile phone 100. Specifically, the input unit 130 may include one or more of a touch panel 131, a camera 132, and another input device 132. The touch panel 131 may be a touch display or a touchpad. The touch display is a device integrating a display and a touch area. The touchpad is a touch-sensitive area of a device that is different from the touch display and that does not display visual output. The touchpad may be a touch-sensitive surface separated from a display panel, or an extension part of a touch-sensitive surface including a touchscreen. The touch panel 131 may collect a touch operation performed by a user on or near the touch panel 131 (such as an operation performed by the user on the touch panel 131 or near the touch panel 131 by using any proper object or accessory, for example, a finger or a stylus), and drive a corresponding connection apparatus based on a preset program. Optionally, the touch panel 131 may include two parts: a touch detection apparatus and a touch controller. The touch detection apparatus detects a touch location of the user, detects a signal brought by the touch operation, and transmits the signal to the touch controller. The touch controller receives touch information from the touch detection apparatus, converts the touch information into touch point coordinates, and sends the touch point coordinates to the processor 180. In addition, the touch controller can receive and execute a command sent by the processor 180. In addition, the touch panel 131 may be implemented in a plurality of types such as a resistive type, a capacitive type, an infrared ray type, and a surface acoustic wave type. The camera 132 may be one or more analog cameras, a digital camera, a depth camera, or a combination of any quantity of the foregoing cameras. The camera 132 may collect a video signal, and transmit the video signal to the processor 180, so that the processor 180 collects an input signal from the video signal (for example, identify a gesture operation of the user from the video signal). In addition to the touch panel 131 and the camera 132, the input unit 130 may include the another input device 133. Specifically, the another input device 133 may include but is not limited to one or more of a physical button board, a function key (such as a volume control key or an on/off key), a trackball, a mouse, a joystick, an electroencephalogram identifier, and a gyroscope. In addition, the input unit 130 may cover a microphone 162, the sensor 150, and the like. In some embodiments, the microphone 162 may collect an audio signal, and transmit the audio signal to the processor, so that the processor collects an input signal from the audio signal (for example, identify a voice operation of the user from the audio signal).

The display unit 140 may be configured to display information entered by the user or information provided for the user, and various menus of the mobile phone 100. The display unit 140 may include one or more of a display panel 141, a projection device 142, and another display device 143. Optionally, the display panel 141 may be configured in a form of an LCD (Liquid Crystal Display, liquid crystal display), an OLED (Organic Light-Emitting Diode, organic light-emitting diode), or the like. Further, the touch panel 131 may cover the display panel 141. When detecting a touch operation on or near the touch panel 131, the touch panel 131 transmits the touch operation to the processor 180 to determine a type of a touch event, and then the processor 180 provides corresponding visual output on the display panel 141 based on the type of the touch event. In FIG. 2, the touch panel 131 and the display panel 141 serve as two independent parts to implement input and input functions of the mobile phone 100. However, in some embodiments, the touch panel 131 and the display panel 141 may be integrated to implement the input and output functions of the mobile phone 100. The projection device 142 may be a mini projector or a 3D holographic projector. The mini projector may be a device that is installed on an intelligent glasses device and that projects, for imaging, an image on a retina of a human eye by using a translucent prism. Alternatively, the mini projector may be a device that projects an image on a display or a screen of the mobile phone for imaging. The 3D (three-dimensional) holographic projector is a device that may directly perform projection in physical space by using an interference and diffraction principle, to present a real three-dimensional image of an object. In addition to the display panel 141 and the projection device 142, the display unit 140 may further include the another display device 142. Specifically, the another display device 142 may include but is not limited to a display device (such as a TV) that is connected to the mobile phone in one or more connection manners such as a wireless local area network, a USB (Universal Serial Bus, Universal Serial Bus) data cable, and an HDMI (High Definition Multimedia Interface, high definition multimedia interface) cable.

The mobile phone 100 may further include at least one type of sensor 150, for example, a light sensor, a motion sensor, and another sensor. Specifically, the light sensor may include an ambient light sensor and a proximity sensor. The ambient light sensor may adjust luminance of the display panel 141 based on brightness of ambient light. The proximity sensor may turn off the display panel 141 and/or backlight when the mobile phone 100 moves to an ear. As a motion sensor, an accelerometer sensor may detect a value of acceleration in each direction (generally, three axes), may detect a value and a direction of gravity in a static state, and may be configured to identify an application of a mobile phone posture (such as switching between a landscape and a portrait, a related game, and magnetometer posture calibration), a function related to vibration identification (such as a pedometer and a strike), and the like. Other sensors such as a gyroscope, a barometer, a hygrometer, a thermometer, and an infrared sensor may be further configured in the mobile phone 100, and details are not described herein.

The audio frequency circuit 160, a loudspeaker 161, and the microphone 162 may provide an audio interface between the user and the mobile phone 100. The audio frequency circuit 160 may transmit, to the loudspeaker 161, an electrical signal obtained after received audio data is converted, and the loudspeaker 161 converts the electrical signal into a sound signal for output. In addition, the microphone 162 converts a collected sound signal into an electrical signal. The audio frequency circuit 160 converts the electrical signal into audio data after receiving the electrical signal, and then outputs the audio data to the processor 180 for processing. The processor 180 sends the audio data to, for example, another mobile phone by using the RF circuit 110, or outputs the audio data to the memory 120 for further processing.

A universal serial bus (USB, Universal Serial Bus) port is configured to communicate with or charge an external device. The mobile phone 100 may perform data transmission with another USB device by using the USB port 170, or implement a charging function by using the USB port 170.

The processor 180 is a control center of the mobile phone 100, is connected to each part of the entire mobile phone by using various interfaces and lines, and executes various functions of the mobile phone 100 and processes data by running or executing the software program and/or the module stored in the memory 120 and invoking data stored in the memory 120, so as to perform overall monitoring on the mobile phone. Optionally, the processor 180 may include one or more processing units. Preferably, the processor 180 may integrate an application processor and a modem processor. The application processor mainly processes an operating system, a user interface, an application program, and the like, and the modem processor mainly processes wireless communication. It can be understood that the foregoing modem processor may be not integrated into the processor 180.

The mobile phone 100 further includes the power supply 190 (for example, a battery) that supplies power to each part. Preferably, the power supply may be logically connected to the processor 180 by using a power management system, so as to implement functions such as charging management, discharging management, and power consumption management by using the power management system.

The mobile phone 100 may have a housing (not shown). The housing may also be referred to as an enclosure, and may be made of any suitable material, including plastic, glass, ceramic, metal, another suitable material, or a combination of these materials. In some implementations, the housing or some parts of the housing may be formed by a dielectric material or another low-conductivity material, so that no interference is caused to a conductive antenna element located near the housing. The housing or some parts of the housing may also be made of a conducting material (such as metal). When the housing is made of a metal element, one or more metal elements may be used as a part of an antenna in the mobile phone 100, such as a radiator or a ground.

Although not shown in the figure, the mobile phone 100 may further include a camera, a Bluetooth module, and the like, and details are not described herein.

In this embodiment of the present invention, a type of the USB port is not limited, and may include a USB type-C (USB Type-C) port, a USB type-A (USB Type-A) port, and a USB type-B (USB Type-B) port.

Figure 3:
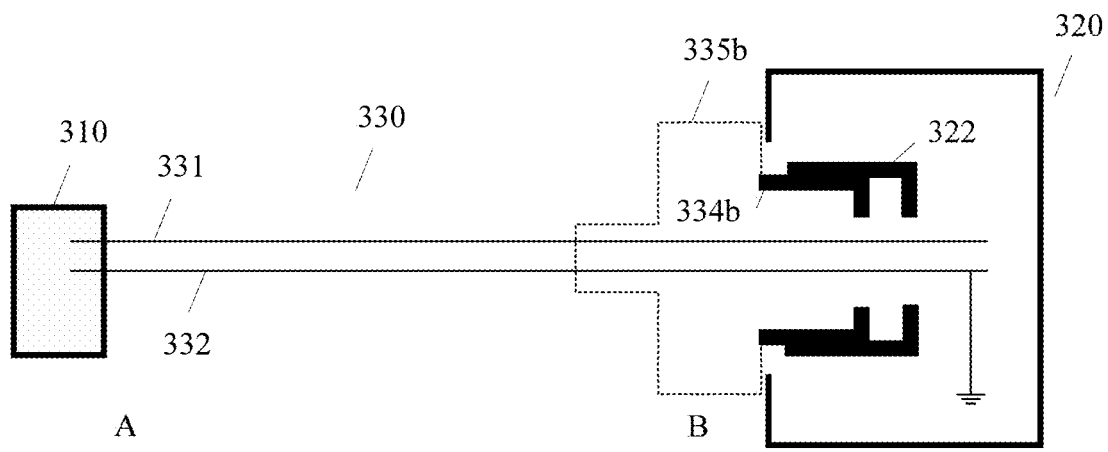
FIG. 3 is a schematic diagram of connection between a USB port on an electronic device and a charger by using a USB cable according to an embodiment of the present invention.

FIG. 3 is a schematic diagram of connection between an electronic device and a charger by using a USB cable. An electronic device 320 is connected to a charger 310 by using a USB cable 330.

In FIG. 3, the USB cable includes two ports: a USB port A and a USB port B, the USB port A of the USB cable 330 is connected to the charger 310, and the USB port B of the USB cable 330 is connected to a USB port of the electronic device. A metal housing 334b of the USB port B of the USB cable 330 is in contact with a metal housing 322 of the USB port of the electronic device, and a plastic housing 335b of the port B of the USB cable 330 is used to press against a housing of the electronic device 320, to fasten and protect the USB port B of the USB cable 330. The USB cable 330 includes a power cable 331, a ground cable 332, a data cable, and the like (not shown in the figure). The power cable 331 is connected to a power pin of the charger and a power pin of the USB port of the electronic device, and the ground cable 332 is connected to a ground pin of the charger and a ground pin of the USB port of the electronic device, so as to perform charging.

The following describes a manner of fastening the metal housing 322 of the USB port of the electronic device 320 to a printed circuit board (printed circuit board, PCB) of the electronic device in an embodiment of the present invention. In this embodiment, the metal housing 322 of the USB port is not connected to a ground of the PCB.

Figure 4:
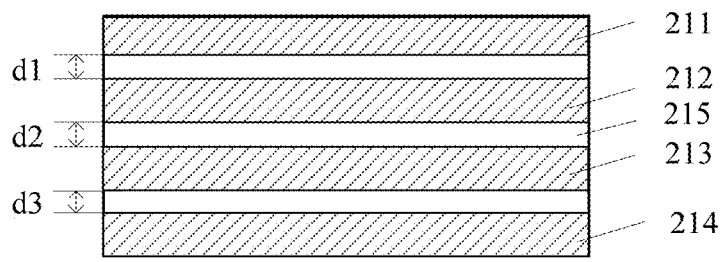
FIG. 4 is a schematic sectional view of a PCB according to an embodiment of the present invention.

The PCB usually has one or more cabling layers, for example, two cabling layers, four cabling layers, or six cabling layers. The cabling layers are isolated by using an insulation medium, and the insulation medium may be an FR-4 material. A line is disposed at the cabling layer, and the line is a tool used for component conduction, grounding, power supplying, and the like. The line is usually made of a metal conducting material such as copper foil or tin. Line layout may be performed at each cabling layer based on a design requirement of the electronic device. Lines located at different cabling layers may be connected based on a design requirement by using a via. For example, ground cables at the cabling layers may be connected by using a via. The PCB in this embodiment of the present invention has at least two cabling layers. FIG. 4 is a schematic sectional view of a PCB according to an embodiment of the present invention. The PCB has a cabling layer 211, a cabling layer 212, a cabling layer 213, and a cabling layer 214, and the four cabling layers are isolated from each other by using insulation media 215. An area at the cabling layer excluding lines is an insulation medium, and the lines are isolated by using the insulation medium.

At least one cabling layer on the PCB has a floating area. The floating area may be made of the same material, such as copper foil, as the line at the cabling layer. The floating area and another line at the same layer are isolated by using an insulation medium. A cabling layer adjacent to the cabling layer of the floating area has a metal area, and the metal area is opposite to the floating area. To be specific, the metal area and an orthographic projection of the floating area on the cabling layer at which the metal area is located have an overlapping part. A plane of the cabling layer at which the metal area is located is used as a first plane, and the orthographic projection of the floating area on the cabling layer at which the metal area is located is a floating image obtained when a shape of the floating area is projected onto the first plane by using a set of light perpendicular to the first plane. That the metal area and the orthographic projection of the floating area on the cabling layer at which the metal area is located have an overlapping part means that the metal area and the floating image overlap on the first plane. The floating area is not connected to the metal area. To be specific, the floating area is not connected to the metal area because there is no conducting medium. The metal area may be the ground of the PCB, a power supply, or the like.

A plurality of floating areas may be located at different cabling layers of the PCB, or a plurality of floating areas are located at one cabling layer of the PCB. When two floating areas located at different cabling layers are opposite to each other, and distances between cabling layers are the same, there is a cabling layer between the two floating areas. In other words, the cabling layers at which the plurality of floating areas are located are not adjacent.

Referring to FIG. 4, a floating area may be disposed at the cabling layer 211, and a metal area opposite to the floating area is disposed at the cabling layer 212. Alternatively, a floating area may be disposed at the cabling layer 212, and a metal area opposite to the floating area may be disposed at the cabling layer 211 or the cabling layer 213. There may be a plurality of floating areas. For example, floating areas are respectively disposed at the cabling layer 211 and the cabling layer 214, and metal areas opposite to the floating areas may be disposed at the cabling layer 212 and the cabling layer 213. If floating areas are respectively disposed at the cabling layer 212 and the cabling layer 213, metal areas opposite to the floating areas may be respectively disposed at the cabling layer 211 and the cabling layer 214. If the two floating areas are opposite to each other (that is, an orthographic projection of a floating area at the cabling layer 212 on the cabling layer 213 and a floating area at the cabling layer 213 have an overlapping area), a distance d2 between the cabling layer 212 and the cabling layer 213 needs to be greater than a distance d1 between the cabling layer 211 and the cabling layer 212, and d2 also needs to be greater than a distance d3 between the cabling layer 213 and the cabling layer 214, so that the floating area and the metal area opposite to the floating area can form a capacitor. If the two floating areas are not opposite to each other, no requirement is imposed on d1, d2, and d3.

One USB port is usually fastened to the PCB, and a metal housing of the USB port usually has two to four fixed contacts. A plurality of fixed contacts of the USB port may be connected to one metal floating area; or may be respectively connected to different floating areas located on a same cabling layer, where different fixed contacts may have different floating areas.

The USB port may be fastened to the PCB in a surface mount manner, a pin fastening manner, or the like.

The surface mount manner is: A fixed contact of the USB port is connected to a connection point of a fixed contact on a surface of the PCB in an adhering manner, and the connection point is a soldering joint. In this manner, if one fixed contact of the USB port is connected to a plurality of floating areas located at different cabling layers of the PCB, the plurality of floating areas may be connected by using a via. A connection point of the fixed contact is disposed on the PCB, and the connection point of the fixed contact is disposed in a floating area at a surface layer of the PCB, or is connected to the floating area of the PCB by using a via or through cabling. In this way, when the fixed contact of the USB port is connected to the connection point of the PCB, the fixed contact of the USB port may be connected to the plurality of floating areas.

The pin fastening manner is: A fixed contact of the USB port is inserted into a connection point of the PCB, the connection point is a connection hole, the fixed contact is fastened to the connection hole through welding, and the connection hole passes through a plurality of cabling layers. In this manner, if one fixed contact of the USB port is connected to a plurality of floating areas located at different cabling layers of the PCB, the connection hole passes through the plurality of floating areas, the fixed contact is inserted into the connection hole to connect to the plurality of floating areas. A line at a cabling layer through which the connection hole passes and that has no floating area is isolated from the connection hole by using an insulation medium; or a line in a floating area at a cabling layer through which the connection hole passes is connected to the connection hole, and the connection hole is not connected to another line.

Based on a circuit configuration requirement, some of the plurality of fixed contacts of the USB port are connected to a floating area of the PCB, and others may be connected to a soldering pad of the PCB. The soldering pad is isolated from all lines on the PCB by using an insulation medium.

In this embodiment of the present invention, the floating area is disposed on the PCB, the fixed contact of the metal housing of the USB port is connected to the floating area to form one electrode of a capacitor, and a metal area that is at an adjacent layer and that is opposite to the floating area form the other electrode of the capacitor, so as to form the capacitor on the PCB. The USB port is usually disposed at a lower part of the electronic device such as a mobile phone, and usually an antenna is also disposed at the lower part of the electronic device. When the USB port performs charging or data transmission, the antenna is interfered with. The capacitor on the PCB that is formed by using the floating area and the metal area that is at an adjacent layer and that is opposite to the floating area can prevent the antenna from being interfered with by the USB port.

Specifically, a relationship between capacitance and an interfering frequency F is $$C = \frac{1}{2*\pi*F*Xc},$$

where C is capacitance, the interfering frequency F is a frequency that is generated by the USB port and that interferes with a radio frequency signal, Xc is characteristic impedance, and Xc is set based on a noise reduction requirement in circuit design. When there are a plurality of interfering frequencies F, a plurality of capacitors C may be disposed. In other words, a plurality of floating areas are disposed.

The capacitance C may be further calculated based on a formula $$F = \frac{1}{2*\pi*\sqrt{L*C}},$$

where F is an interfering frequency, and L is a specified value. Therefore, the capacitance C is calculated.

Capacitance formed by two metal plates that are opposite to each other and that are connected to different electrodes may be obtained through calculation based on a calculation formula $$C = \frac{\varepsilon*s}{4*\pi*k*d},$$

where ε is a dielectric constant, s is an area of overlap of an electrode, d is an electrode distance, k is an electrostatic constant, and k=9.0×10^9 N·m2/C2. For a capacitor formed by a floating area and a metal area opposite to the floating area on the PCB, a value of the dielectric constant E is determined based on a material type of the insulation medium on the PCB, s is an area of overlap of the floating area and the metal area, and the electrode distance d is specifically a spacing distance between the floating area and the metal area, that is, a distance between a cabling layer at which the floating area is located and a cabling layer at which the metal area is located. Therefore, an area of overlap of a floating area and a metal area opposite to the floating area on the PCB, a distance between cabling layers, and a material of an insulation medium may be designed based on required capacitance. For example, if the required capacitance is 33PF, the distance between the layers of the PCB is 0.1 mm, the insulation material is FR-4, and ε of FR-4 is 4.2, it is obtained through calculation that s=10.685 mm².

Figure 5:
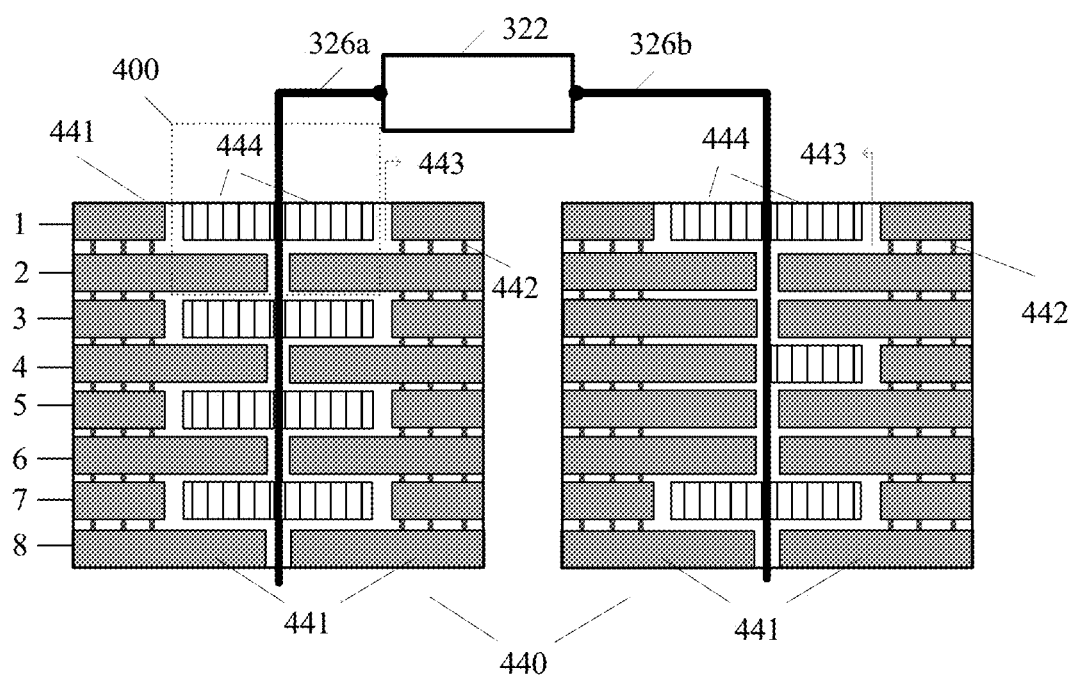
FIG. 5 is a schematic diagram of connection between a USB port on an electronic device and a PCB according to an embodiment of the present invention.

As shown in FIG. 5, FIG. 5 is an implementation of connection between a USB port and a PCB in an electronic device according to an embodiment of the present invention. In FIG. 5, an example in which the PCB has a cabling layer 1 to a cabling layer 8 is used for description. The cabling layer 1 to the cabling layer 8 are mutually isolated by using insulation media 443. Each of the cabling layer 1 to the cabling layer 8 is disposed with a ground 441, and the grounds 441 are connected by using a via 442.

Floating areas 444 may be disposed at cabling layers 1, 3, 5, and 7 on the PCB in a fixed area of the USB port that is connected to a fixed contact 326a of the USB port. Floating areas 444 may be disposed at cabling layers 1, 4, and 7 on a PCB area connected to a fixed contact 326b. In FIG. 5, an example in which a line that is adjacent to the floating area 444 and that is at the same layer as the floating area 444 is a ground cable, and a metal area that is at an adjacent layer and that is opposite to the floating area 444 is a ground cable is used for description. In an actual product, the line that is adjacent to the floating area 444 and that is at the same layer as the floating area 444 or the metal area that is at an adjacent layer and that is opposite to the floating area 444 may also be a line outside the ground cable. In FIG. 5, the floating area 444 and the adjacent ground 441 at the same layer are isolated by using an insulation medium, and the floating area 444 and the ground at an adjacent layer are isolated by using an insulation medium, and are not connected. A ground is disposed in a metal area that is at an adjacent layer and that is opposite to the floating area 444, so as to implement better noise return.

FIG. 5 shows two fixed contacts 326a and 326b of a metal housing 322 of the USB port. The metal housing 322 is fastened to the PCB 440 by using the fixed contacts 326a and 326b, and is in contact with the floating area 444 on the PCB 440. The PCB 440 in the electronic device is usually one PCB. FIG. 5 is a sectional view of a part, on a PCB, to which the USB port is fastened.

Figure 8:
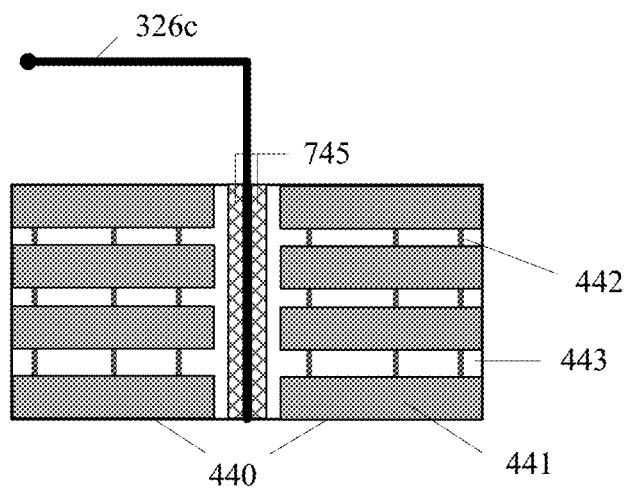
FIG. 8 is another schematic diagram of connection between a fixed contact of a USB port on an electronic device and a PCB according to an embodiment of the present invention.

FIG. 8 may also show a manner of fastening some fixed contacts of a USB port to a PCB. A fixed contact 326c is fastened to the PCB by using a via hole 745. The via hole 745 is not connected to the ground cable 441.

The metal housing 322 of the USB port is not connected to a ground of the PCB 440. When charging is performed by using the USB port, a current path: power pin→perspiration→metal housing of the USB port cannot be formed. Therefore, a case in which heat accumulates and the USB port is burned does not occur.

Figure 6A:
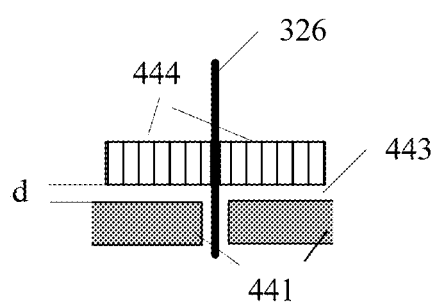
FIG. 6a is a schematic partial view of a dotted line box 400 in FIG. 5.
Figure 6B:
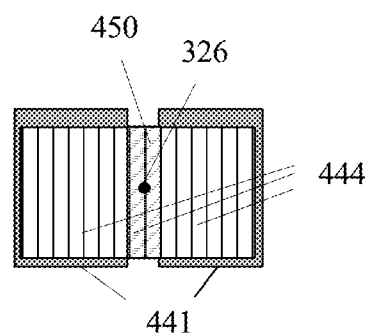
Figure 6C:
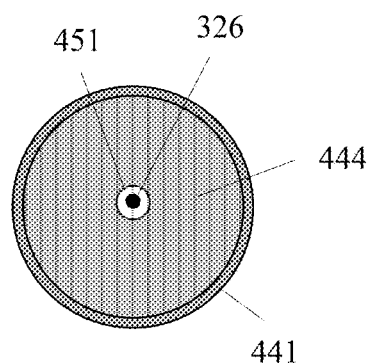
Figure 6D:
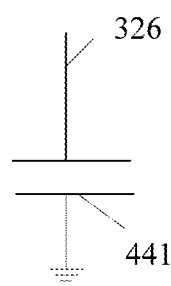

As shown in FIG. 6a, FIG. 6a is a schematic diagram of a dotted line part 400 in FIG. 5. The floating area 444 and the ground 441 at an adjacent cabling layer form a capacitor, and an area of overlap s is an area in which an orthographic projection of the floating area 444 on the adjacent cabling layer and the ground overlap. As shown in FIG. 6b, FIG. 6b is a possible implementation of FIG. 6a. The area of overlap s is obtained by subtracting a non-overlapping area 450 from an area of the floating area 444. As shown in FIG. 6c, FIG. 6c is another possible implementation of FIG. 6a. The area of overlap s is obtained by subtracting a non-overlapping area 451 from an area of the floating area 444. The non-overlapping area 451 may be ignored if the non-overlapping area 451 is small enough. An electrode distance d is a distance between the floating area 444 and the ground 441 (as shown in FIG. 6a). Therefore, as shown in FIG. 6d, the capacitor is formed.

Figure 7:
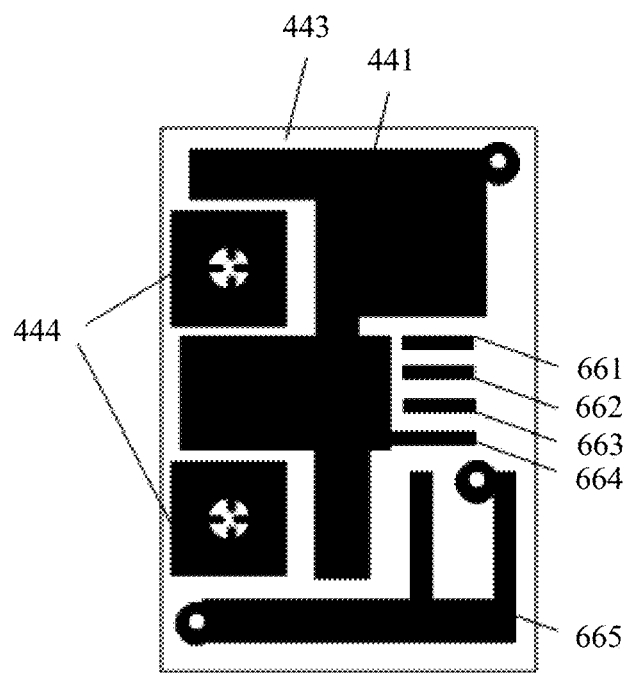
FIG. 7 is a front view of a PCB according to an embodiment of the present invention.

As shown in FIG. 7, FIG. 7 is a schematic diagram of cabling at a cabling layer on a PCB according to an embodiment of the present invention. A power pin soldering joint 661 for a USB port, data pin soldering joints 662 and 663, a ground soldering joint 664, floating areas 444, a ground 441, and another line 665 are disposed at one cabling layer. Other areas excluding these lines are insulation media 443. The floating area 444 is isolated from the adjacent ground cable 441, and the floating area 444 is isolated from the another line 665. The floating area 444 is disposed with cross-shaped cabling connected to a fixed contact of the USB port. The cross-shaped cabling may be replaced with star-shaped cabling, or may be cabling of another shape.

Figure 9:
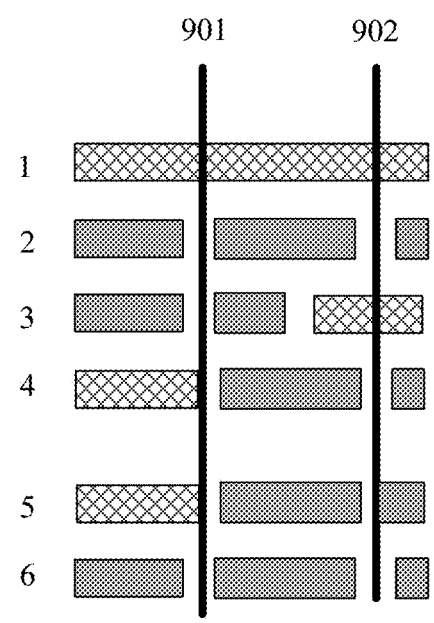
FIG. 9 is still another schematic diagram of connection between a fixed contact of a USB port on an electronic device and a PCB according to an embodiment of the present invention.

FIG. 9 is another implementation of connection between a USB port and a PCB in an electronic device according to an embodiment of the present invention. The PCB has a cabling layer 1 to a cabling layer 6. In FIG. 9, a grid block is a floating area, a gray block is another line, and floating areas are disposed at cabling layers 1, 3, 4, and 5. A fixed contact 901 and a fixed contact 902 of the USB port may be connected to a same floating area (for example, a floating area at the cabling layer 1). A floating area at the cabling layer 4 is opposite to a floating area at the cabling layer 5. A distance between the cabling layer 4 and the cabling layer 5 is greater than a distance between the cabling layer 3 and the cabling layer 4, and is also greater than a distance between the cabling layer 5 and the cabling layer 6.

The foregoing describes an implementation of fastening the USB port of the electronic device to the PCB in the embodiments of the present invention. To prevent a short circuit of the USB port, a corresponding USB cable or charger is required.

Figure 10:
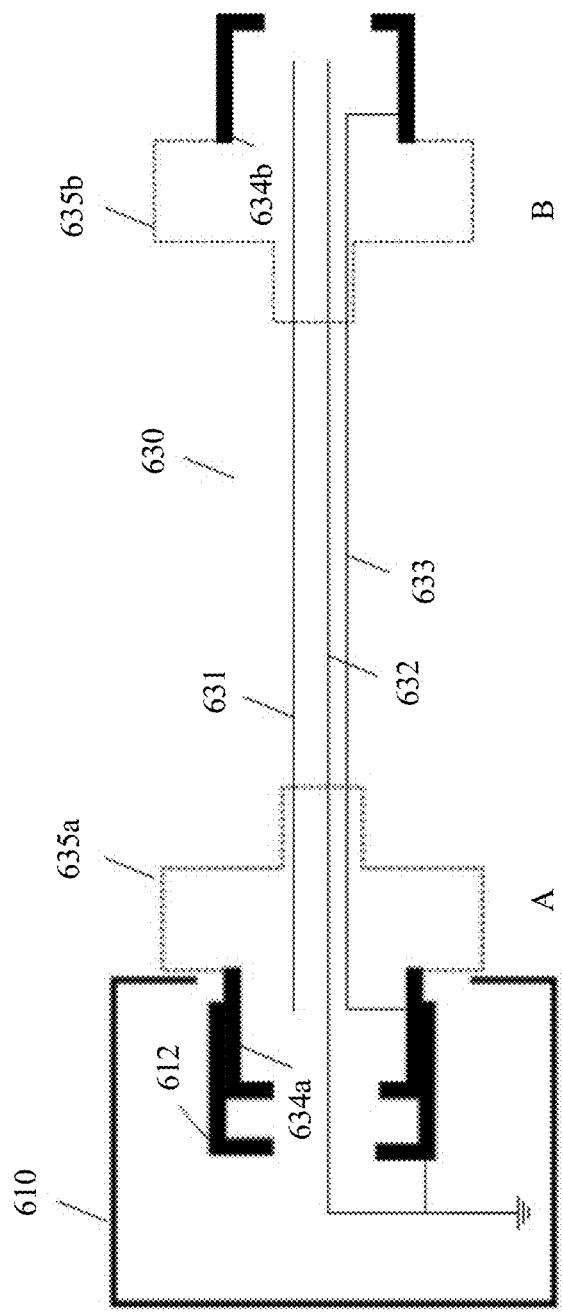
FIG. 10 is a schematic diagram of a USB cable in the prior art.

FIG. 10 shows a charger and a USB cable in the prior art. A metal housing 612 of a USB port of a charger 610 is connected to a ground of the charger 610 by using a fixed contact. A USB cable 630 includes a power cable 631, a ground cable 632, a shielding cable 633, a data cable, and the like (not shown in the figure). Similar to descriptions of the power cable 331 and the ground cable 332, the power cable 631 and the ground cable 632 are used to connect an electronic device and the charger for charging. The data cable is used to transmit data. During manufacturing, the shielding cable 633 and metal housings 634a and 634b of two USB ports of the USB cable 630 are pressed together, so that the shielding cable 633 is connected to the metal housings 634a and 634b. It can be learned that, when the USB port of the charger 610 is connected to a USB port A of the USB cable 630 in the prior art, the metal housing 612 of the USB port of the charger 610 is connected to the metal housing 634a of the USB port A of the USB cable. In this case, the shielding cable 633 is grounded, so that the metal housing 634b of a USB port B of the USB cable is grounded. When the USB port B of the USB cable 630 is connected to a USB port of the electronic device, a metal housing of the USB port of the electronic device is grounded. Consequently, a short circuit described in the background still occurs.

Figure 11:
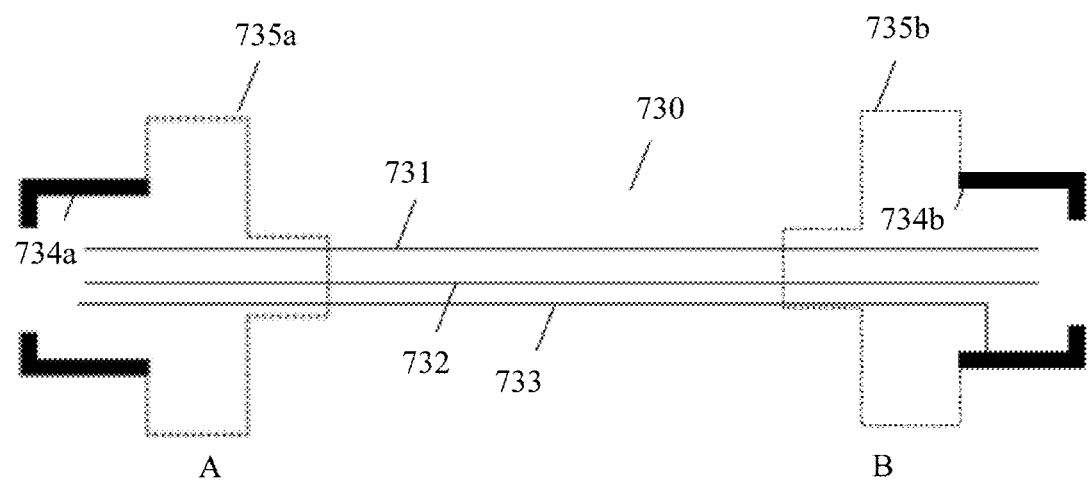
FIG. 11 is a schematic diagram of a USB cable according to an embodiment of the present invention.

FIG. 11 shows a USB cable according to an embodiment of the present invention. A USB cable 730 includes a power cable 731, a ground cable 732, a shielding cable 733, a data cable, and the like (not shown in the figure). The power cable 731 and the ground cable 732 are used to connect an electronic device and a charger for charging, and the data cable is used to transmit data. The shielding cable 733 is connected to a metal housing 734b of a USB port B of the USB cable 330, and the shielding cable 733 is not connected to a metal housing 734a of a USB port A of the USB cable.

When the USB port A of the USB cable 730 is connected to the USB port of the charger 610 in FIG. 10, and the USB port B of the USB cable 730 is connected to the USB port of the electronic device 320, because the shielding cable 733 of the USB cable is not connected to the metal housing of the USB port A on a side close to the USB port A, the shielding cable 733 is not grounded even when the metal housing 612 of the USB port of the charger 610 is grounded. Therefore, the metal housing 322 of the USB port of the electronic device 320 is not grounded, so that a short circuit of the USB port of the electronic device can be prevented.

Optionally, both the metal housings of the USB port A and the USB port B of the USB cable may not be connected to the shielding cable.

Optionally, the USB port and the PCB in the charger may be connected in a manner shown in FIG. 5 and FIG. 9. For details, refer to related descriptions in FIG. 5 and FIG. 9. Details are not described herein again. Optionally, the USB port and the PCB in the charger may also be connected in a manner shown in FIG. 8. The metal housing of the USB port in the charger is fastened to the PCB by using a fixed contact, and the fixed contact is not connected to the ground 4 of the PCB. The USB port and the PCB in the charger may also be connected by using a combination of manners in FIG. 5/FIG. 9 and FIG. 8.

A charging system includes an electronic device, a charger, and a USB cable. When a USB port and a PCB in the charger are connected in a manner shown in FIG. 5/FIG. 9 or in a manner shown in FIG. 8, the charger may be connected to the electronic device 320 in the foregoing embodiment by using a USB cable 630 or a USB cable 730, so as to resolve a short circuit problem of the USB port of the electronic device. A USB port and a PCB in the electronic device are connected in a manner shown in FIG. 5 or FIG. 9, and the electronic device is used in conjunction with the USB cable 730, or in conjunction with the charger in which a USB port and a PCB are connected in a manner shown in FIG. 5, FIG. 8, or FIG. 9. Therefore, the short circuit of the USB port of the electronic device can be resolved, and EMI interference to an antenna can be eliminated.

The USB cable in this embodiment of the present invention may be further configured to transmit data between two electronic devices. For the USB cable, refer to FIG. 11. The USB port B of the USB cable 730 is connected to the USB port of the electronic device 320, and the USB port A of the USB cable 730 is connected to a USB port of another electronic device. Optionally, both the metal housings of the USB port A and the USB port B of the USB cable may not be connected to the shielding cable.

Optionally, the USB port and a PCB of the another electronic device may be connected in a manner of connecting the USB port and the PCB in the foregoing electronic device, for example, in a manner shown in FIG. 5 and FIG. 9. For details, refer to related descriptions in FIG. 5 and FIG. 9. Details are not described herein again.

A data transmission system includes a first electronic device, a second electronic device, and a USB cable. In a first optional manner, a USB port and a PCB in the first electronic device are connected in a manner shown in FIG. 5 or FIG. 9, or by using a combination of manners in FIG. 5/FIG. 9 and FIG. 8. The USB cable is implemented in a manner shown in FIG. 11. A USB port B is connected to the first electronic device, and a USB port A is connected to the second electronic device. There is no requirement imposed on a manner of connecting a USB port and a PCB of the second electronic device. In a second optional manner, the USB port and the PCB of the first electronic device and the second electronic device are connected in a manner shown in FIG. 5 or FIG. 9, or by using a combination of manners in FIG. 5/FIG. 9 and FIG. 8, and no requirement is imposed on the USB cable.

What is claimed is:

1. An electronic device, wherein the electronic device comprises a universal serial bus (USB) port and a printed circuit board;
    the printed circuit board has at least two cabling layers, a first cabling layer in the at least two cabling layers has a first floating area and a line outside the first floating area, there is an insulation medium between the first floating area and the line outside the first floating area, a second cabling layer in the at least two cabling layers and the first cabling layer are adjacent and isolated by using an insulation material, the second cabling layer has a first metal area, an orthographic projection of the first floating area on the second cabling layer and the first metal area have an overlapping area, and the first floating area is not electrically connected to the first metal area; and
    a metal housing of the USB port has a plurality of fixed contacts, the plurality of fixed contacts are fastened to the printed circuit board, the plurality of fixed contacts are not electrically connected to a ground of the printed circuit board, the plurality of fixed contacts comprise a first fixed contact, the first fixed contact is connected to the first floating area, and the first fixed contact is not connected to the first metal area.

2. The electronic device according to claim 1, wherein capacitance formed by the first floating area and the first metal area is $$\frac{\varepsilon * s}{4 * \pi * k * d},$$

wherein s is an area of overlap of the first floating area and the first metal area, d is a distance between the first floating area and the first metal area, ε is a dielectric constant of the insulation medium, and k is an electrostatic constant.

3. The electronic device according to claim 1, wherein the printed circuit board has a second floating area, the second floating area is located at the first cabling layer, the second cabling layer has a second metal area, an orthographic projection of the second floating area on the second cabling layer and the second metal area have an overlapping area, and the second floating area is not connected to the second metal area; and
    the plurality of fixed contacts of the USB port comprise a second fixed contact, the second fixed contact is connected to the second floating area, and the second fixed contact is not connected to the second metal area.

4. The electronic device according to claim 1, wherein a third cabling layer in the at least two cabling layers has a third floating area, a fourth cabling layer in the at least two cabling layers and the third cabling layer are adjacent and isolated by using an insulation medium, the fourth cabling layer is disposed with a third metal area, an orthographic projection of the third floating area on the fourth cabling layer and the third metal area have an overlapping area, and the third floating area is not connected to the third metal area; and
    the first fixed contact is connected to the first floating area and the third floating area, and the first fixed contact is not connected to the first metal area and the third metal area.

5. The electronic device according to claim 4, wherein the first cabling layer is not adjacent to the third cabling layer.

6. The electronic device according to claim 1, wherein the first metal area is the ground of the printed circuit board.

7. A charger, comprising:
    a printed circuit board that has at least two cabling layers, the at least two cabling layers are isolated from each other by using an insulation material, a first cabling layer in the at least two cabling layers has a first floating area and a line outside the first floating area, there is an insulation medium between the first floating area and the line outside the first floating area, a second cabling layer in the at least two cabling layers and the first cabling layer are adjacent and isolated by using an insulation medium, the second cabling layer has a first metal area, an orthographic projection of the first floating area on the second cabling layer and the first metal area have an overlapping area, and the first floating area is not electrically connected to the first metal area; and
    a universal serial bus (USB) port that has a plurality of fixed contacts, the fixed contacts are fastened to the printed circuit board, and the fixed contacts are not electrically connected to a ground of the printed circuit board, wherein the plurality of fixed contacts comprise a first fixed contact, the first fixed contact is connected to the first floating area, and the first fixed contact is not connected to the first metal area.

8. The charger according to claim 7, wherein a soldering pad is disposed on the printed circuit board, and the soldering pad is isolated from a line on the printed circuit board by using an insulation material; and
    that the fixed contact is not connected to a ground of the printed circuit board is specifically: the fixed contact is connected to the soldering pad.

9. A charging system, comprising:
    an electronic device comprising a universal serial bus (USB) port and a printed circuit board, wherein:
        the printed circuit board has at least two cabling layers, a first cabling layer in the at least two cabling layers has a first floating area and a line outside the first floating area, there is an insulation medium between the first floating area and the line outside the first floating area, a second cabling layer in the at least two cabling layers and the first cabling layer are adjacent and isolated by using an insulation material, the second cabling layer has a first metal area, an orthographic projection of the first floating area on the second cabling layer and the first metal area have an overlapping area, and the first floating area is not electrically connected to the first metal area; and a metal housing of the USB port has a plurality of fixed contacts, the plurality of fixed contacts are fastened to the printed circuit board, the plurality of fixed contacts are not electrically connected to a ground of the printed circuit board, the plurality of fixed contacts comprise a first fixed contact, the first fixed contact is connected to the first floating area, and the first fixed contact is not connected to the first metal area;

a charger; and a USB cable comprising a first USB port, a second USB port, a shielding cable, and a ground cable, wherein:
the shielding cable comprises a first end and a second end, the first end is close to the first USB port of the USB cable, and the second end is close to the second USB port of the USB cable;
the first end is not connected to a metal housing of the first USB port of the USB cable;
the shielding cable is not connected to the ground cable; and
wherein the first USB port of the USB cable is configured to connect to the charger, and the second USB port of the USB cable is configured to connect to the electronic device.

10. The charging system according to claim 9, wherein the second end of the shielding cable is not connected to a metal housing of the second USB port of the USB cable.

11. The charging system according to claim 9, wherein the second end of the shielding cable is connected to a metal housing of the second USB port of the USB cable.

12. The charging system according to claim 9, wherein the charger further comprises:
a printed circuit board that has at least two cabling layers, the at least two cabling layers are isolated from each other by using an insulation material, a first cabling layer in the at least two cabling layers has a first floating area and a line outside the first floating area, there is an insulation medium between the first floating area and the line outside the first floating area, a second cabling layer in the at least two cabling layers and the first cabling layer are adjacent and isolated by using an insulation medium, the second cabling layer has a first metal area, an orthographic projection of the first floating area on the second cabling layer and the first metal area have an overlapping area, and the first floating area is not electrically connected to the first metal area; and
a universal serial bus (USB) port that has a plurality of fixed contacts, the fixed contacts are fastened to the printed circuit board, and the fixed contacts are not electrically connected to a ground of the printed circuit board, wherein the plurality of fixed contacts comprise a first fixed contact, the first fixed contact is connected to the first floating area, and the first fixed contact is not connected to the first metal area.

* * * * *